(12) United States Patent
Buot et al.

(10) Patent No.: US 11,322,490 B2
(45) Date of Patent: May 3, 2022

(54) MODULAR CAPACITOR ARRAY

(71) Applicant: QUALCOMM Incorporated, San Diego, CA (US)

(72) Inventors: Joan Rey Villarba Buot, Escondido, CA (US); Zhijie Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 7 days.

(21) Appl. No.: 16/851,357

(22) Filed: Apr. 17, 2020

(65) Prior Publication Data

US 2021/0327864 A1 Oct. 21, 2021

(51) Int. Cl.

| | |
|---|---|
| *H01L 25/18* | (2006.01) |
| *H01L 25/00* | (2006.01) |
| *H01G 4/30* | (2006.01) |
| *H01L 23/31* | (2006.01) |
| *H01L 23/495* | (2006.01) |
| *H01L 23/00* | (2006.01) |
| *H01L 27/01* | (2006.01) |
| *H01L 49/02* | (2006.01) |

(52) U.S. Cl.
CPC .............. *H01L 25/18* (2013.01); *H01G 4/30* (2013.01); *H01L 23/3121* (2013.01); *H01L 23/49541* (2013.01); *H01L 23/49589* (2013.01); *H01L 24/16* (2013.01); *H01L 24/81* (2013.01); *H01L 25/50* (2013.01); *H01L 27/01* (2013.01); *H01L 28/40* (2013.01); *H01L 2224/16227* (2013.01); *H01L 2224/81203* (2013.01); *H01L 2924/19011* (2013.01); *H01L 2924/19041* (2013.01)

(58) Field of Classification Search
CPC ................. H01L 28/40; H01L 25/0652; H01L 2924/19041; H01L 25/50; H01L 23/49589; H01L 2924/19011; H01L 25/18; H01G 4/30

See application file for complete search history.

(56) References Cited

U.S. PATENT DOCUMENTS

| | | | |
|---|---|---|---|
| 2007/0138632 A1* | 6/2007 | Tsai | H05K 3/3452 257/724 |
| 2009/0004774 A1* | 1/2009 | Lee | H01L 23/49575 438/107 |
| 2011/0075321 A1* | 3/2011 | Yamaguchi | H01G 4/1227 361/313 |
| 2018/0366423 A1* | 12/2018 | Ong | H01L 23/5384 |

* cited by examiner

*Primary Examiner* — Jasmine J Clark
(74) *Attorney, Agent, or Firm* — Paterson & Sheridan, L.L.P.

(57) ABSTRACT

Certain aspects of the present disclosure generally relate to a modular capacitor array, such as for an integrated circuit package, and methods for fabricating the same. One example integrated circuit package generally includes a package substrate, a semiconductor die disposed above the package substrate, and at least one modular capacitor array disposed below the package substrate. The modular capacitor array may be a pre-packaged array of capacitive elements, such as multi-layer ceramic capacitors (MLCCs).

14 Claims, 6 Drawing Sheets

MODULAR CAPACITOR ARRAY

BACKGROUND

Field of the Disclosure

Certain aspects of the present disclosure generally relate to electronic devices and, more particularly, to a modular capacitor array for use in an integrated circuit package.

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices.

In some cases, an IC is powered by a voltage regulator that converts available wall voltages to the lower voltages used by the IC. The voltage regulator ensures a predictable power supply is provided to the IC. As transistors in the IC turn on and off, the power load changes rapidly placing additional demand on the voltage regulator. The distance between the voltage regulator and the IC creates a long response time, preventing the voltage regulator from increasing power to the IC instantaneously, especially when the transistors switch on and off millions or billions of times each second. Decoupling capacitors provide additional stability to the power supplied to the IC. For instance, decoupling capacitors may reduce IC electrical impedance to ground for high-frequency transients and enable the IC to maintain a near-constant voltage across all operating frequencies.

Decoupling capacitors located in close proximity to the IC provide a local charge reservoir for the IC. As demand on the power supply changes rapidly, the capacitor provides a localized supply of power and can recharge at a later time when the power demand decreases. However, as transistor sizes have decreased and transistor densities have increased, finding area on the IC for decoupling capacitors has become increasingly challenging. In certain cases, capacitors (e.g., metal-oxide-semiconductor (MOS) capacitors) are built from thick oxide transistors commonly used for input/output (I/O) transistors. These capacitors are fabricated on the substrate to provide decoupling capacitance for the circuitry on the substrate. Thick oxide transistors offer very small values of capacitance in comparison to the large amounts of substrate area they consume that could otherwise be used for other circuitry. In some cases, the capacitors (e.g., deep trench capacitors) are formed from an array of deep trenches in a substrate and filled with an electrical insulator (e.g., a dielectric) between layers of electrodes. In other cases, the capacitors are attached on the land side under the IC die shadow (land-side capacitor: LSC) or adjacent to the die on the die side (die-side capacitor: DSC), where the capacitors are used for the reduction of the impedance at high frequency.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include desirable electrical performance of an integrated circuit package with a modular capacitor array serving as decoupling capacitors and more surface area on a package substrate for land-side components (such as land-side capacitors) and/or solder balls of a ball grid array.

Certain aspects of the present disclosure provide an integrated circuit package. The integrated circuit package generally includes a package substrate, a semiconductor die disposed above the package substrate, and at least one modular capacitor array disposed below the package substrate.

Certain aspects of the present disclosure provide a modular capacitor array. The modular capacitor array generally includes a leadframe, a plurality of conductive pads coupled to the leadframe, a plurality of capacitive elements coupled to the plurality of conductive pads, and an encapsulation material covering the leadframe and surrounding at least portions of the plurality of capacitive elements.

Certain aspects of the present disclosure provide a method of fabricating an integrated circuit package. The method generally includes coupling a semiconductor die to a first side of a package substrate and coupling at least one modular capacitor array to a second side of the package substrate.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to an integrated circuit package, a modular capacitor array, and a method of fabricating an integrated circuit package.

In the micro-electronic technology industry, there is a continuous demand and evolution of processes, technologies, and assembly methodologies to design and implement smaller, more efficient integrated circuit (IC) packages (also referred to as a "chip package"). A power distribution network (PDN) is used to deliver power from a power supply/source to the integrated circuit(s) in a chip package. The PDN inherently suffers from noise and/or resonance, which interfere with the integrated circuits that the PDN is meant to power. For instance, excessive voltage drops in the power grid may reduce switching speeds and noise margins of semiconductor devices in the integrated circuit packages, which may lead to functional failures of the semiconductor devices. Passive electrical devices, such as decoupling capacitors, may be used on the integrated circuit package to provide a local storage of charge that reduces the voltage drop encountered at the semiconductor die(s).

Decoupling capacitors may be coupled on a land side of an IC package, opposite from a die. In certain cases, the land-side capacitors (LSCs) may be attached to a package substrate before the semiconductor die, which is attached to the die side of the package substrate with a compression bonding process, for example. As the LSCs are already attached to the package substrate, a keep-out zone may surround the perimeters of the LSCs on the package substrate. In certain cases, the width of certain portions of the keep-out zone may be larger than the pitch between solder balls of the package substrate. A temporary support structure (e.g., a coining jig) may be placed in the keep-out zone as the semiconductor die is being attached with compression bonding. Without the support structure, the package substrate may break under the compression forces used to attach the semiconductor die. Unfortunately, the keep-out zone reduces the surface area on the package substrate available for land-side components (such as the LSCs) or solder balls of the ball grid array (BGA), which may provide input-output pins and/or structural support. Therefore, the keep-out zone may limit the number of decoupling capacitors that can be added to a particular integrated circuit package, and thus, the keep-out zone may affect the performance of the integrated circuit package.

In certain cases, the LSCs may be discrete surface mount capacitors. The package substrate may have conductive pads spaced to match the terminals of the surface mount capacitors. In certain cases, the pitch of the conductive pads for the LSCs on the package substrate may be larger than the pitch of the other conductive pads for the BGA. That is, the package substrate may have conductive pads whose placement conforms to the terminal spacing of the LSCs, which may be larger than the pitch of the conductive pads for the BGA balls. Thus, the LSCs may not allow for a single, desirable pitch across the entire land side surface of the package substrate.

Certain aspects of the present disclosure generally relate to a modular capacitor array, an integrated circuit package with the modular capacitor array, and a method of fabricating the integrated circuit package. The modular capacitor array may be an integrated passive device with terminals that match the pitch of the BGA on a package substrate of an integrated circuit package. That is, the modular capacitor array may serve as an interposer to convert the terminals of the discrete capacitors embedded in the integrated passive device to match the pitch of the BGA. In certain cases, due to the modular capacitor array matching the pitch of the BGA, the pitch of the BGA may be smaller than the width of the capacitor terminals embedded in the modular capacitor array.

In aspects, the modular capacitor array may provide a large number of capacitors per integrated passive device. As the modular capacitor array is a discrete electrical component, the modular capacitor array may be tested separately from an integrated circuit package before the module capacitor array is attached to the integrated circuit package. In aspects, the modular capacitor array may be configured to match the design of the package substrate. That is, the modular capacitor array may be a reconfigurable integrated passive device.

In certain aspects, the modular capacitor arrays may enable the package substrate to be formed without a keep-out zone. For example, the modular capacitor arrays may be attached to the land side of the package substrate after the semiconductor die is attached. In such a case, the package substrate can be supported during the compression bonding process across its entire surface without a keep-out zone. As the keep-out zone is eliminated, BGA pad depopulation may also be eliminated from the fabrication process. In certain cases, the modular capacitor array may enable the pitch of the BGA to be uniform across the package substrate. In certain aspects, use of the modular capacitor array (as compared to an equal number of individual surface-mount capacitors) may provide more surface area on the package substrate for land-side components (such as the LSCs) and/or solder balls of the BGA. That is, there may be no limitation on the number of capacitors implemented in the modular capacitor array (e.g., due to the keep-out zone). The modular capacitor arrays may facilitate a desirable number of decoupling capacitors coupled on the land side of the package substrate, and thus, the modular capacitor arrays may provide more desirable electrical performance of the integrated circuit package.

Figure 1A:
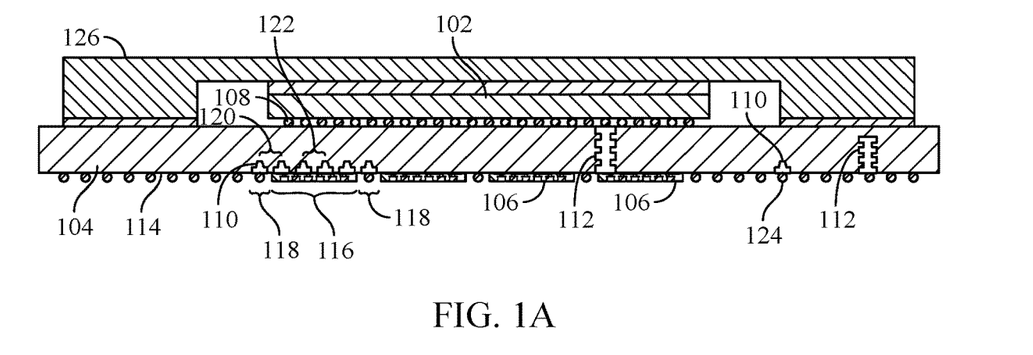
FIG. 1A illustrates a cross-sectional view of an example integrated circuit (IC) package having a capacitive element, in accordance with certain aspects of the present disclosure.

In certain aspects, an integrated circuit package may employ one or more modular capacitor arrays, as further described herein, as decoupling capacitors. For example, FIG. 1A is a cross-sectional view of an example integrated circuit (IC) package 100 having modular capacitor arrays, in accordance with certain aspects of the present disclosure. As shown, the integrated circuit package 100 may include a semiconductor die 102 (also referred to as "the die"), a package substrate 104, and one or more modular capacitor arrays 106. The integrated circuit package 100 may be, for example, a fan-out wafer-level package.

The die 102 may be, for example, a processor or an application processor such as the processor of a system-on-a-chip (SoC). The die 102 is disposed above the package substrate 104. In aspects, the die 102 may include conductive pillars 108 coupled to the package substrate 104. The conductive pillars 108 may include copper (Cu) pillars. In certain cases, the die 102 may include solder balls instead of the conductive pillars 108.

The package substrate 104 may be a wiring substrate such as a coreless embedded trace substrate (ETS) or a wiring substrate with a core substrate material insulating layers disposed above and/or below the core material. The package substrate 104 may provide access to the input/output (I/O) of the die 102 via one or more redistribution layers (not shown) that distribute (e.g., fan-out) the I/O of the die 102 across a wider area, for example, to facilitate interconnections with a circuit board.

The package substrate 104 may include conductive pads 110 and electrical routing 112, such as conductive traces and vias, embedded in the package substrate 104. In aspects, the conductive pads 110 may be disposed across a surface 114 of the package substrate. As shown, one of the modular capacitor arrays 106 is coupled to a first set 116 of the conductive pads 110, where the first set 116 of the conductive pads 110 is adjacent to a second set 118 of the conductive pads. In certain cases, a first pitch 120 between at least one of the conductive pads 110 in the first set 116 and at least one of the conductive pads 110 in the second set 118 is less than or equal to a second pitch 122 between the conductive pads 110 in the first set 116. In certain cases, the conductive pads 110 in the first and second sets 116, 118 may have a uniform pitch. Additionally, or alternatively, all of the conductive pads 110 may have a uniform pitch. That is, the pitch may be the same across all of the conductive pads 110 on the surface 114 of the package substrate 104.

Solder balls 124 may be coupled to the second set 118 of conductive pads 110. The solder balls 124 may be electrically coupled to the I/O pins of the die 102 through the electrical routing 112 of the package substrate 104. The solder balls 124 may enable the integrated circuit package 100 to be mounted and electrically coupled to external circuitry (not shown), such as a circuit board. The solder balls 124 may form a solder ball grid array (BGA) with the modular capacitor arrays 106 disposed adjacent to a portion of the solder balls 124, for example, as depicted in FIG. 1B illustrating a bottom view of the integrated circuit package 100.

In certain aspects, at least one of the modular capacitor arrays 106 includes a plurality of capacitive elements such as multi-layer ceramic capacitors (MLCCs). The modular capacitor arrays 106 may be disposed below the package substrate 104 and coupled to a portion of the conductive pads 110. In other words, the modular capacitor arrays 106 are disposed on a land side of the IC package 100 between electrical contacts (e.g., the solder balls 124) extending across the surface 114 of the package substrate 104. The modular capacitor arrays 106 may serve as decoupling capacitors for the circuitry of the die 102. For example, the modular capacitor arrays 106 may be electrically coupled to the circuitry of the die 102 through the electrical routing 112 of the package substrate 104. The land-side positioning of the modular capacitor arrays 106 may enable a reduction in parasitic effects encountered at the die 102 due to the close proximity of the modular capacitor arrays 106 to the circuitry of the die 102. In certain cases, the modular capacitor arrays 106 may provide desirable power delivery to the die.

In certain aspects, an encapsulation material 126 may be disposed above the package substrate 104 and surround the die 102. The encapsulation material 126 may be an epoxy resin or other suitable molding compound. In aspects, the encapsulation material 126 may serve as a structural support that encapsulates the die 102. In aspects, the encapsulation material 126 may also prevent or at least reduce physical damage and corrosion of the electrical components of the integrated circuit package 100.

Figure 1B:
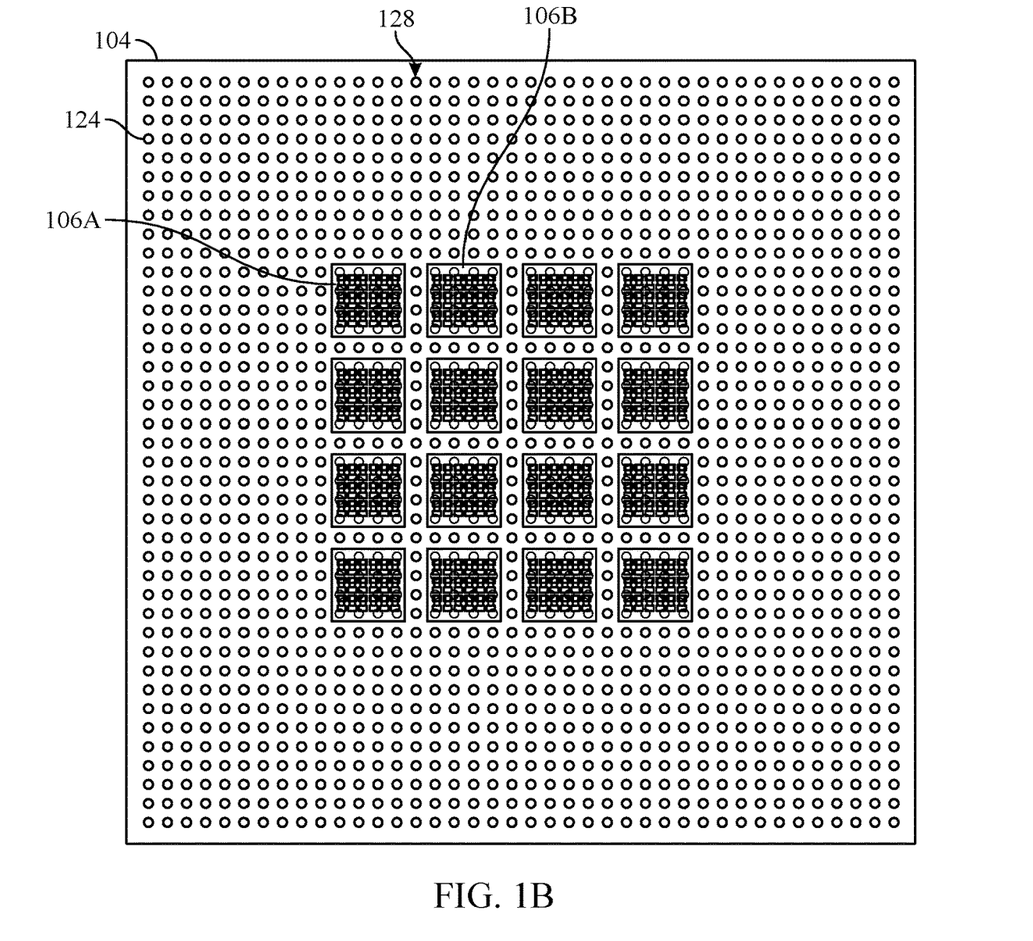
FIG. 1B illustrates a bottom view of the IC package of FIG. 1A, in accordance with certain aspects of the present disclosure.

Referring to FIG. 1B, the modular capacitor arrays 106 may include a first modular capacitor array 106A disposed below the package substrate 104 and a second modular capacitor array 106B disposed below the package substrate 104 and adjacent to the first modular capacitor array 106A. In aspects, the integrated circuit package 100 may further include at least one row 128 (or column, depending on the orientation of the IC package 100) of the solder balls 124 disposed between the first modular capacitor array 106A and the second modular capacitor array 106B. As shown in FIG. 1B, the keep-out zone has been eliminated, and thus, the pitch of the solder balls 124 may be uniform across the entire land side of the package substrate 104.

While the examples depicted in FIGS. 1A and 1B are described herein with respect to an integrated circuit package with a single semiconductor die to facilitate understanding, aspects of the present disclosure may also be applied to an integrated circuit package with multiple semiconductor dies, such as a fan-out wafer-level package-on-package (PoP) assembly.

Example Modular Capacitor Array

Figure 2A:
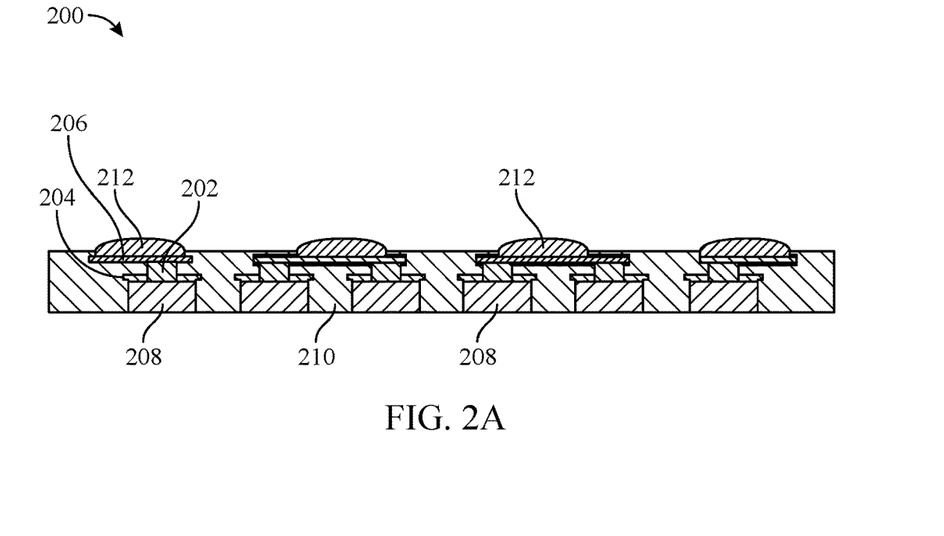
FIG. 2A illustrates a cross-sectional view of an example modular capacitor array, in accordance with certain aspects of the present disclosure.

FIG. 2A illustrates a cross-sectional view of an example modular capacitor array 200, in accordance with certain aspects of the present disclosure. As shown, the modular capacitor array 200 includes a leadframe 202, first conductive pads 204, second conductive pads 206, capacitive elements 208, and an encapsulation material 210. In certain cases, the modular capacitor array 200 may also include solder balls 212 disposed above the second conductive pads 206. The modular capacitor array 200 may be an integrated passive device. That is, the modular capacitor array 200 may be an electrically passive component without any active semiconductor devices.

The leadframe 202 may be an electrically conductive structure that routes the terminals of the capacitive elements 208 to the pitch configuration of the integrated circuit package. In aspects, the leadframe 202 may also electrically couple the capacitive elements 208 in various electrical configurations, such as parallel, series, or a combination thereof. In aspects, the first and second conductive pads 204, 206 may be coupled to or integrated with the leadframe 202. The first conductive pads 204 may be coupled to the terminals of the capacitive elements 208, and the second conductive pads 206 may be configured to couple with the land side of the package substrate. That is, the second conductive pads 206 may match the pitch of the conductive pads of the package substrate. In aspects, the solder balls 212 may be disposed above the second conductive pads 206.

The capacitive elements 208 may be discrete capacitors, such as surface mount capacitors, coupled to the first conductive pads 204. In certain cases, the capacitive elements 208 may be multi-layer ceramic capacitors (MLCCs). In aspects, the capacitive elements 208 may be metal-insulator-metal (MIM) capacitors, metal-oxide-metal (MOM) capacitors, metal-oxide-semiconductor (MOS) capacitors, metal fringe capacitors, trench capacitors, junction capacitance of diodes or transistors, or a combination thereof.

The encapsulation material 210 may cover the leadframe 202 and surround at least portions of the capacitive elements 208. The encapsulation material 210 may be an epoxy resin or other suitable molding compound. In certain cases, the encapsulation material 210 may include a film-assisted molding. That is, the encapsulation material 210 (such as an epoxy molding compound) may be formed through a film-assisted transfer molding process, where the epoxy molding compound is applied to the leadframe 202 and portions of the capacitive elements. Then the epoxy molding compound may be covered with a film (or foil), which protects the transfer molding tool from the epoxy molding compound. In aspects, the encapsulation material 210 may serve as a structural support that maintains the interconnection between the capacitive elements 208 and the leadframe 202. In aspects, the encapsulation material 210 may also prevent or at least reduce physical damage and corrosion of the electrical components (e.g., the leadframe 202 and capacitive elements 208) of the modular capacitor array 200.

Figure 2B:
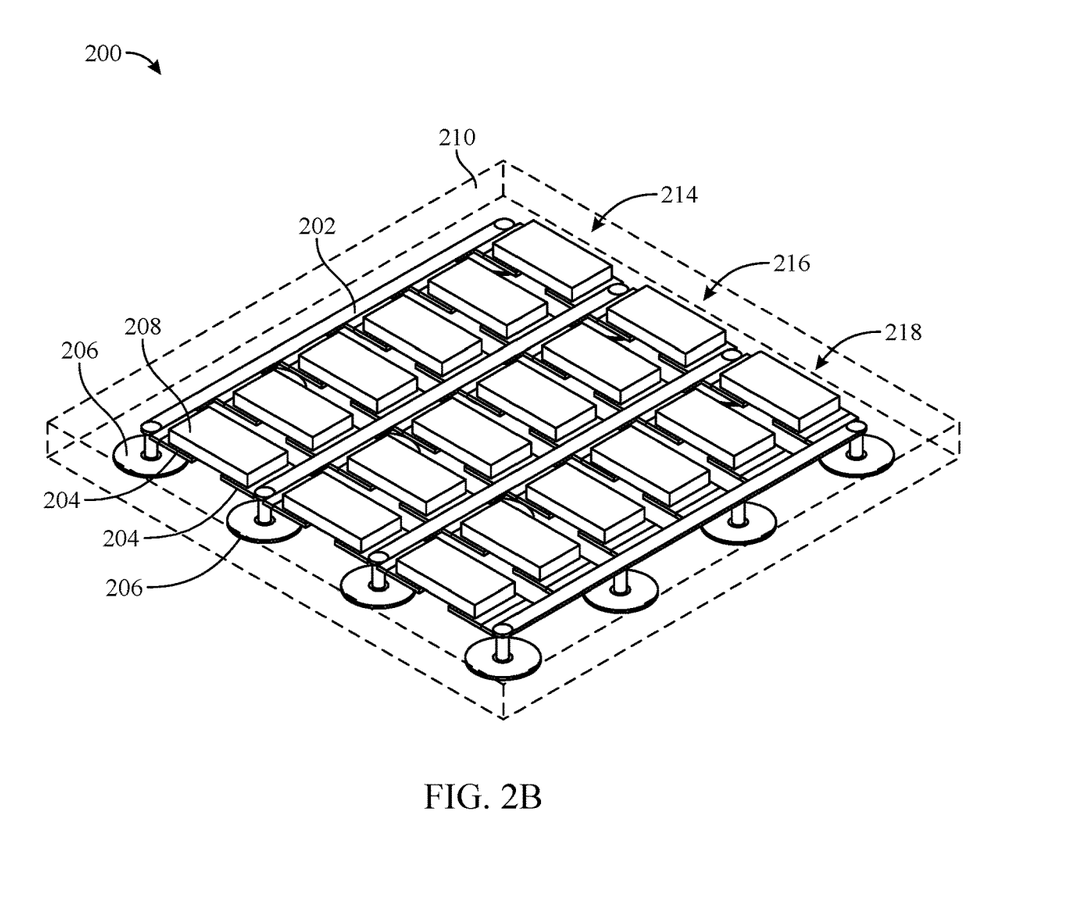
FIG. 2B illustrates an isometric view of the example modular capacitor array of FIG. 2A, in accordance with certain aspects of the present disclosure.

FIG. 2B illustrates an isometric view of the modular capacitor array 200, in accordance with certain aspects of the present disclosure. As shown, multiple rows of the capacitive elements 208 may be electrically coupled in parallel through the leadframe 202. For example, the modular capacitor array 200 may include a first row 214 of capacitive elements 208, a second row 216 of capacitive elements 208, and a third row 218 of capacitive elements 208. The first row 214 of capacitive elements 208 may be electrically coupled in parallel with each other through the leadframe 202. As the first and second rows 214, 216 of capacitive elements 208 may share a positive rail of the leadframe 202, the first and second rows 214, 216 of capacitive elements 208 may be electrically coupled in parallel with each other through the leadframe 202. As the second and third rows 216, 218 of capacitive elements 208 may share a ground rail of the leadframe 202, the third row 218 of capacitive elements 208 may be electrically coupled in parallel with each other through the leadframe 202.

In this example, the third row 218 of capacitive elements 208 may provide an equivalent capacitance circuit, and the first and second rows 214, 216 of capacitive elements 208 may provide another equivalent capacitance. In certain cases, the equivalent capacitance circuit of the third row 218 may be separately routed in the package substrate from the other equivalent capacitance circuit of the first and second rows 214, 216. In certain cases, the equivalent capacitance of each row 214, 216, 218 may be electrically coupled together (e.g., in parallel) in the package substrate of the integrated circuit package, for example, to form a combined equivalent capacitance.

While the examples depicted in FIGS. 2A and 2B are described herein with respect to a modular capacitor array with a certain number of rows of capacitors and a single layer of capacitors to facilitate understanding, aspects of the present disclosure may also be applied to a modular capacitor array with various numbers of rows and/or layers of capacitors. While the examples depicted in FIGS. 2A and 2B are described herein with respect to a modular capacitor array as a leadframe package to facilitate understanding, aspects of the present disclosure may also be applied to the modular capacitor array being a passive embedded substrate. That is, the modular capacitor array may be a wiring substrate assembly with the capacitive elements interconnected and embedded therein.

Figure 3A:
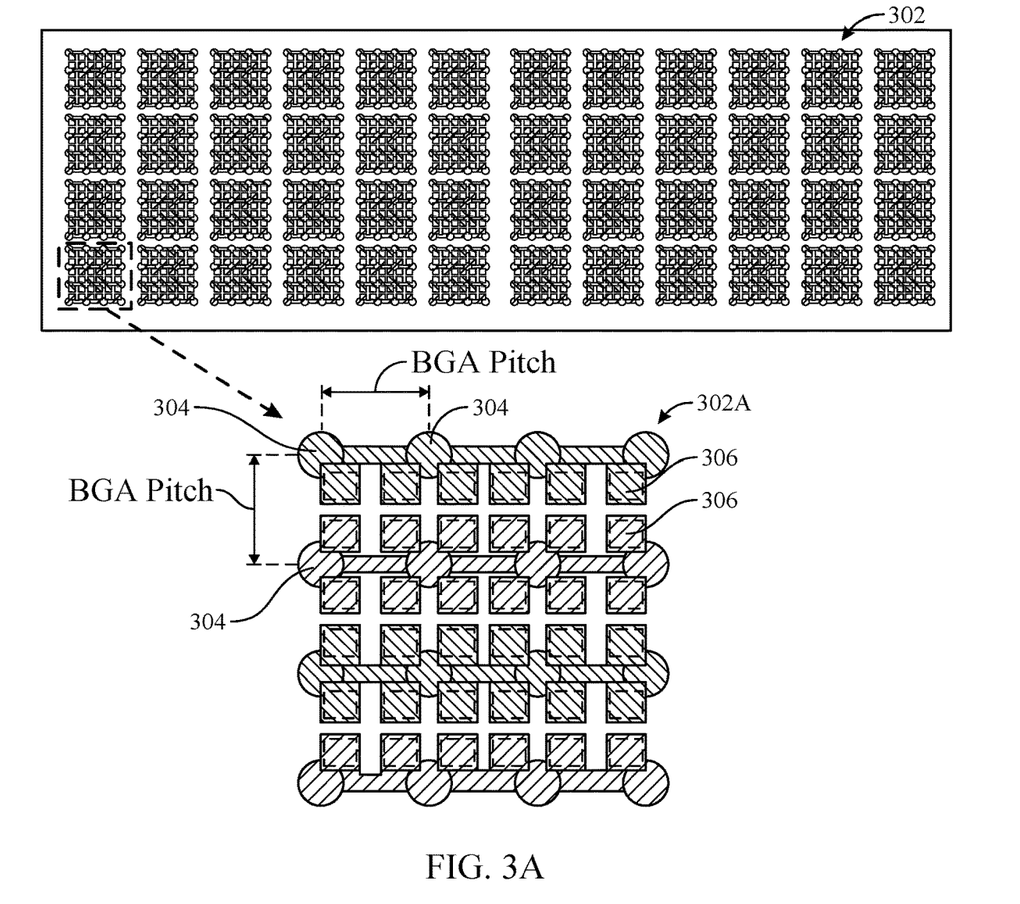
FIGS. 3A, 3B, 4A, and 4B illustrate example operations for fabricating a modular capacitor array, in accordance with certain aspects of the present disclosure.
Figure 3B:
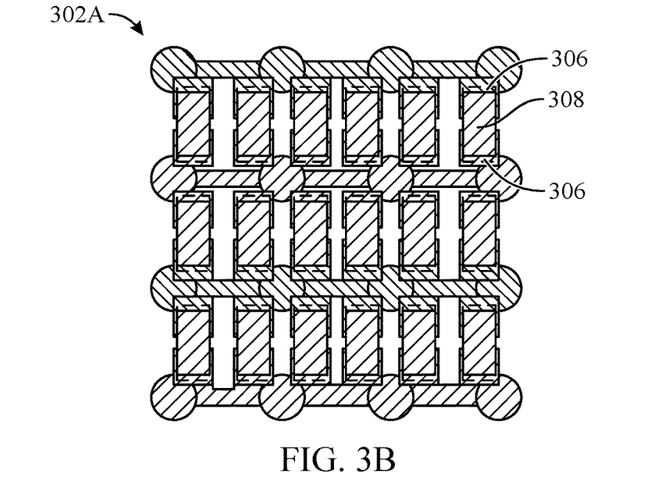
Figure 4A:
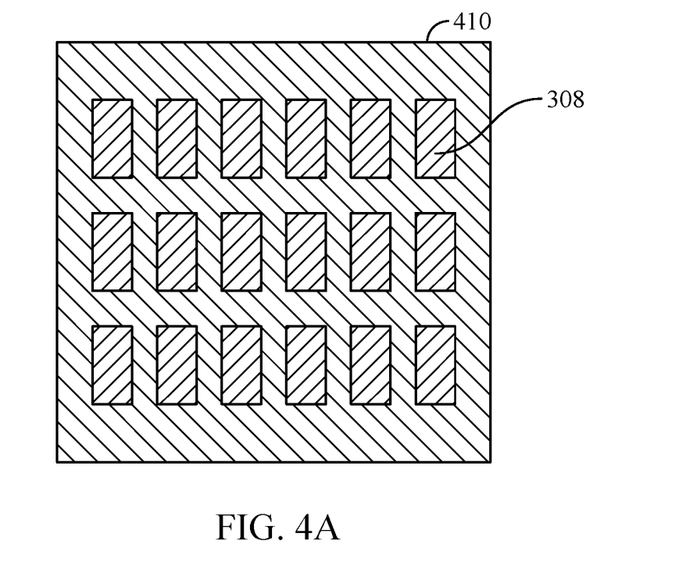
Figure 4B:
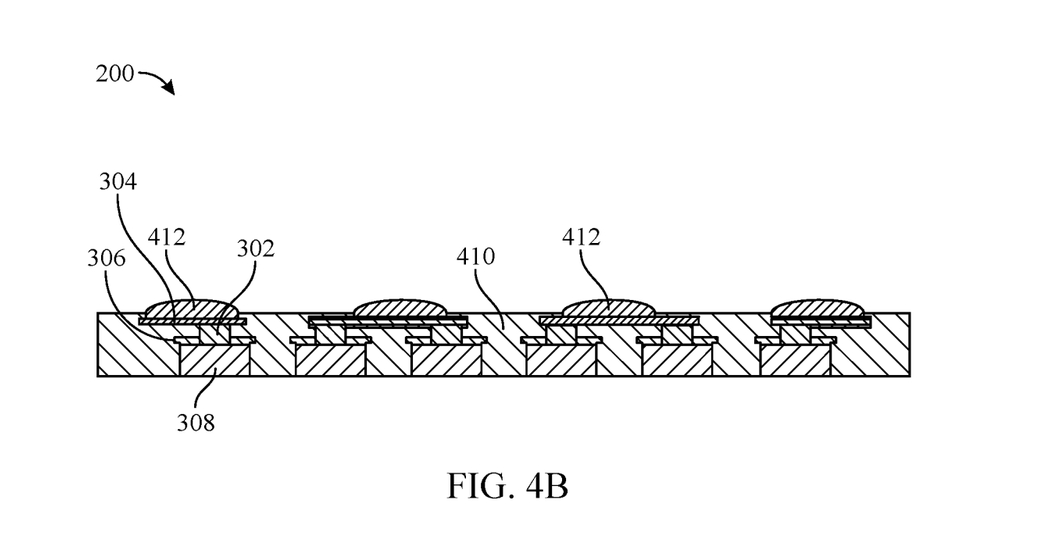

FIGS. 3A-4B illustrate example operations for fabricating modular capacitor arrays, in accordance with certain aspects of the present disclosure. FIGS. 3A, 3B, and 4A illustrate top views of an example leadframe assembly, and FIG. 4B illustrates a cross-sectional view of the example leadframe assembly. The operations may be performed by a component fabrication facility, for example.

As shown in FIG. 3A, multiple leadframes 302 may be formed, for example, from a plate of conductive material (e.g., copper or a copper-alloy). For instance, portions of the conductive plate may be removed to form the electrical routing pattern of the leadframes 302. In aspects, the BGA pitch of the package substrate may be identified, and the conductive pads for the leadframes may be designed according to the identified pitch. Referring to the leadframe 302A, first conductive pads 304 may be formed to match the BGA pitch of the package substrate, and second conductive pads 306 may be formed to match the terminal spacing of the capacitive elements. For certain aspects, the first conductive pads 304 may be disposed on a lower level of the leadframe than the second conductive pads 306. For other aspects, the first and second conductive pads 304, 306 may occupy the same layer and, in some cases, may overlap. As illustrated in FIG. 3B, the capacitive elements 308 may be disposed above and coupled to the second conductive pads 306 of the leadframe 302A, for example.

Referring to FIG. 4A, an encapsulation material 410 may be applied to portions of the leadframe 302A (not shown) and the capacitive elements 308. For example, the encapsulation material 410 may be applied using a film-assisted transfer molding process. The encapsulation material 410 may be an epoxy resin or other suitable molding compound. In certain cases, the encapsulation material 410 may include a film-assisted molding. In certain aspects, the surfaces of the capacitive elements 308 may be flush with the surface of the encapsulation material 410. For other aspects, the capacitive elements 308 may be buried within the encapsulation material 410. As depicted in FIG. 4B, solder balls 412 may be formed on the first conductive pads 304. In aspects, the fabrication processes described herein with respect to FIGS. 3B and 4A may be performed across the multiple leadframes 302, and singulation of the packaged capacitor arrays may be performed such that the multiple packaged capacitor arrays may be diced into individual modular capacitor arrays, such as the modular capacitor array 200.

Figure 5A:
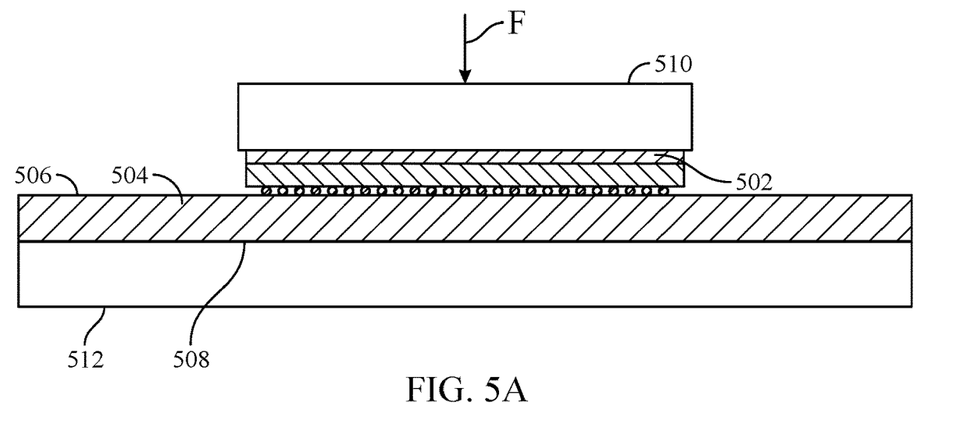
FIGS. 5A, 5B, and 5C illustrate example operations for fabricating an integrated circuit package with at least one modular capacitor array, in accordance with certain aspects of the present disclosure.
Figure 5B:
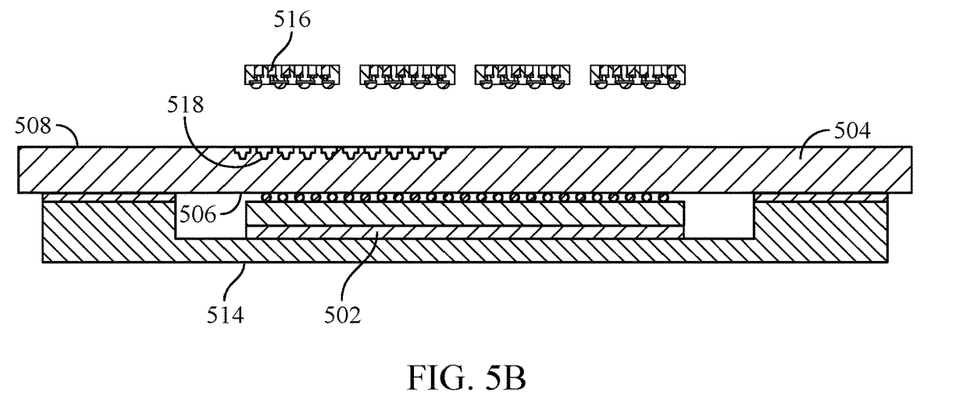
Figure 5C:
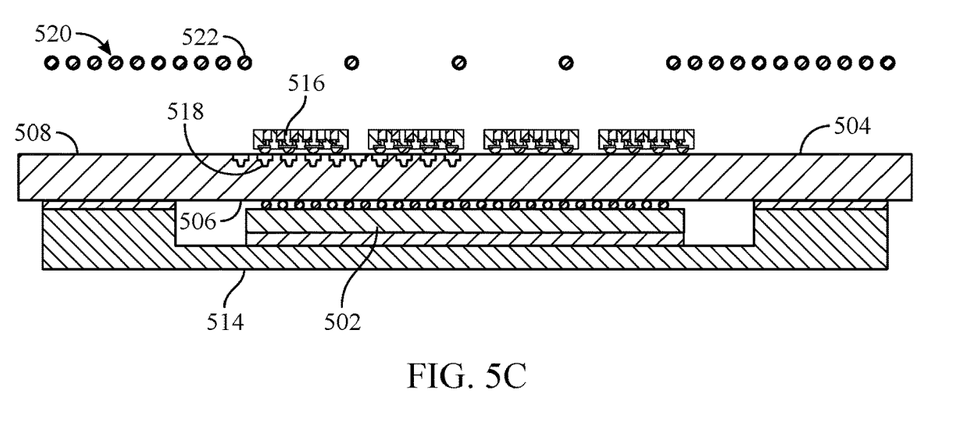

FIGS. 5A, 5B, and 5C illustrate example operations for fabricating an integrated circuit package, in accordance with certain aspects of the present disclosure. The operations may be performed by an integrated circuit fabrication facility, for example. In aspects, the integrated circuit package may be formed by first forming the package substrate on a wafer or temporary carrier, removing organic solderability preservatives from the package substrate, attaching the semiconductor die to the package substrate (for example, using a compression bonding process), performing a deflux process for flux removal, performing capillary underfill, removing sealant and thermal interface materials, attaching a heat spreader, attaching the modular capacitor arrays, and then mounting the BGA and performing reflow. In other words, the modular capacitor arrays may be attached to the package substrate after the semiconductor die is attached, and thus, eliminating the keep-out zone for a support structure (such as a coining jig) during the compression bonding process.

As shown in FIG. 5A, the semiconductor die 502 may be coupled to the first side 506 of the package substrate 504 with a compression bonding process. For example, a ram 510 may engage the semiconductor die 502 and apply a force (F) to the semiconductor die 502 as a structure 512 engages the second side 508 of the package substrate 504. That is, the package substrate 504 may be supported by the structure 512 engaged with the second side 508 of the package substrate 504 during the compression bonding process. In aspects, the structure 512 may engage the entire second side 508 of the package substrate 504, and thus, a keep-out zone on the package substrate for the support structure is unnecessary. The second side 508 may be opposite to the first side 506 of the package substrate 504. In certain aspects, the structure 512 may be a substrate layer or temporary carrier. In certain cases, the compression bonding process may be performed before the modular capacitor arrays (and solder balls) are coupled to the package substrate 504. The compression bonding process may include a thermocompression bonding process. That is, the semiconductor die 502 may be bonded to the first side 506 of the package substrate 504 by applying the force and heat (e.g., at a temperature of 260 to 450° C.) simultaneously.

Referring to FIG. 5B, an encapsulation material 514 may be applied to the first side 506 of the package substrate and cover the semiconductor die 502, and modular capacitor arrays 516 may be coupled to the second side 508 of the package substrate 504. In aspects, the package substrate 504 may be formed with conductive pads 518 across the second side 508 of the package substrate 504. The modular capacitor arrays 516 may be coupled to a portion of the conductive pads 518, for example, as described herein with respect to FIGS. 1A and 1B.

As illustrated in FIG. 5C, a ball grid array (BGA) 520 with a plurality of solder balls 522 may be coupled to the remaining conductive pads 518 of the package substrate 504.

Figure 6:
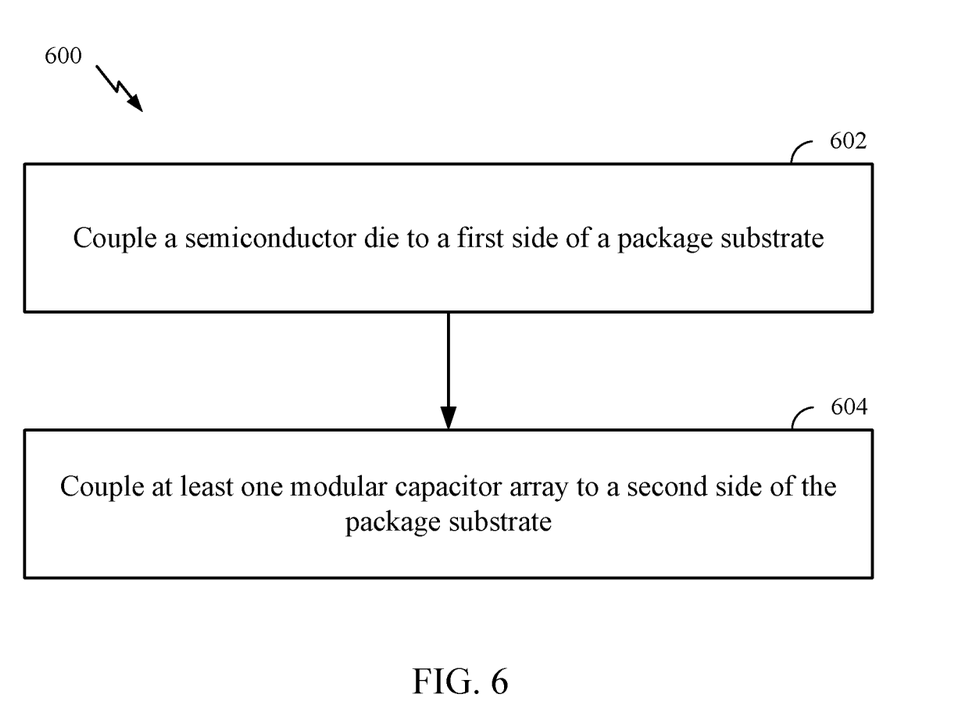
FIG. 6 is a flow diagram of example operations for fabricating an integrated circuit package with at least one modular capacitor array, in accordance with certain aspects of the present disclosure.

FIG. 6 is a flow diagram of example operations 600 for fabricating an integrated circuit package with at least one modular capacitor array (e.g., the modular capacitor array 200 depicted in FIG. 2), in accordance with certain aspects of the present disclosure. The operations 600 may be performed by an integrated circuit fabrication facility, for example. In certain cases, the integrated circuit fabrication facility may also be capable of fabricating leadframe packages, such as the modular capacitor arrays.

The operations 600 begin, at block 602, by coupling a semiconductor die (e.g., the semiconductor die 502) to a first side (e.g., the first side 506) of a package substrate (e.g., the package substrate 504). At block 604, at least one modular capacitor array (e.g., the modular capacitor array 516) may be coupled to a second side (e.g., the second side 508) of the package substrate.

In aspects, coupling the semiconductor die at block 602 may include coupling the semiconductor die to the first side of the package substrate with a compression bonding process. In certain cases, the compression bonding process is performed before the at least one modular capacitor array is coupled to the package substrate at block 604. In aspects, the package substrate is supported by a structure (e.g., the structure 512) engaged with the second side of the package substrate during the compression bonding process. In certain aspects, the compression bonding process may include a thermocompression bonding process.

In aspects, the operations 600 may include forming the at least one modular capacitor array having a plurality of capacitors (e.g., the capacitive elements 208) at least partially embedded in an encapsulation material (e.g., the encapsulation material 210). For example, the operations 600 may include fabricating modular capacitor arrays as described herein with respect to FIGS. 3A, 3B, 4A, and 4B. Forming the modular capacitor arrays may include coupling a plurality of capacitors (e.g., the capacitive elements 308) to a leadframe (e.g., the leadframe 302A) with conductive pads (e.g., the first and second conductive pads 304, 306). The encapsulation material (e.g., the encapsulation material 410) may be applied to portions of the leadframe and the plurality of capacitors, and solder balls (e.g., the solder balls 412) may be on a portion of the conductive pads (e.g., the first conductive pads 304) of the leadframe. In aspects, coupling the at least one modular capacitor array at block 602 may include coupling the at least one modular capacitor array to the second side of the package substrate through solder balls (e.g., the solder balls 412).

In aspects, the package substrate may be formed with conductive pads (e.g., the conductive pads 518) across the second side of the package substrate. In certain cases, the conductive pads of the package substrate may have various pitches as described herein with respect to FIG. 1A. As an example, the conductive pads may include a first set of the conductive pads (e.g., the first set 116) adjacent to a second set of the conductive pads (e.g., the second set 118). A first pitch (e.g., the first pitch 120) between at least one of the conductive pads in the first set and at least one of the conductive pads in the second set is less than or equal to a second pitch (e.g., the second pitch 122) between the conductive pads in the first set. Coupling the at least one modular capacitor array at block 602 may include coupling the at least one modular capacitor array to the first set of the conductive pads. In aspects, forming the package substrate may include forming the conductive pads in the first and second sets with a uniform pitch. In certain aspects, forming the package substrate may include forming the conductive pads with a uniform pitch.

In aspects, the operations 600 may further include forming a ball grid array (e.g., the BGA 520) with a plurality of solder balls (e.g., the solder balls 522) coupled to the second set of the conductive pads.

It should be appreciated that the modular capacitor array as described herein may enable desirable electrical performance of the integrated circuit package with the modular capacitor array serving as one or more decoupling capacitors. In certain aspects, the relatively compact size of the modular capacitor array may provide more surface area on the package substrate for land side components (such as land side capacitors) and/or solder balls of the BGA.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An integrated circuit package comprising:
 a package substrate including a first plurality of conductive pads disposed across a surface of the package substrate;
 a semiconductor die disposed above the package substrate; and
 at least one modular capacitor array disposed below the package substrate, wherein the at least one modular capacitor array is coupled to a first set of the first plurality of conductive pads, wherein the first set of the first plurality of conductive pads is adjacent to a second set of the first plurality of conductive pads, and wherein a first pitch between at least one of the conductive pads in the first set and at least one of the conductive pads in the second set is less than or equal to a second pitch between the conductive pads in the first set.

2. The integrated circuit package of claim 1, wherein the at least one modular capacitor array comprises:
 a leadframe;
 a second plurality of conductive pads coupled to the leadframe;
 a plurality of capacitive elements coupled to the second plurality of conductive pads; and
 an encapsulation material covering the leadframe and surrounding at least portions of the plurality of capacitive elements.

3. The integrated circuit package of claim 2, wherein the modular capacitor array is an integrated passive device.

4. The integrated circuit package of claim 2, wherein the encapsulation material comprises a film-assisted molding.

5. The integrated circuit package of claim 2, wherein the plurality of capacitive elements comprises at least one multi-layer ceramic capacitor.

6. The integrated circuit package of claim 1, wherein the conductive pads in the first and second sets have a uniform pitch.

7. The integrated circuit package of claim 1, wherein the first plurality of conductive pads have a uniform pitch.

8. The integrated circuit package of claim 1, further comprising a plurality of solder balls coupled to the second set of the conductive pads and arranged as a ball grid array.

9. An integrated circuit package comprising:
 a package substrate;
 a semiconductor die disposed above the package substrate; and
 at least one modular capacitor array disposed below the package substrate, wherein the at least one modular capacitor array comprises a first modular capacitor array disposed below the package substrate and a second modular capacitor array disposed below the package substrate and adjacent to the first modular capacitor array, and wherein the integrated circuit package further comprises at least one row of solder balls disposed between the first modular capacitor array and the second modular capacitor array.

10. A method of fabricating an integrated circuit package, comprising:
 coupling a semiconductor die to a first side of a package substrate, wherein coupling the semiconductor die comprises coupling the semiconductor die to the first side of the package substrate with a compression bonding process; and
 coupling at least one modular capacitor array to a second side of the package substrate.

11. The method of claim 10, wherein the compression bonding process is performed before the at least one modular capacitor array is coupled to the package substrate.

12. The method of claim 10, wherein the package substrate is supported by a structure engaged with the second side of the package substrate during the compression bonding process.

13. The method of claim 10, wherein the compression bonding process includes a thermocompression bonding process.

14. The method of claim 10, further comprising forming the at least one modular capacitor array having a plurality of capacitors at least partially embedded in an encapsulation material.

* * * * *